United States Patent
Yonley (10) Patent No.: US 11,169,298 B2
(45) Date of Patent: Nov. 9, 2021

(54) SHAPED SENSOR COIL FOR ATTENUATING MOTION-INDUCED NOISE DURING REMOTE FIELD TESTING OF PIPE

(71) Applicant: HALLIBURTON ENERGY SERVICES, INC., Houston, TX (US)

(72) Inventor: Thomas Louis Yonley, Houston, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 78 days.

(21) Appl. No.: 15/579,358

(22) PCT Filed: Jul. 20, 2016

(86) PCT No.: PCT/US2016/043163
§ 371 (c)(1),
(2) Date: Dec. 4, 2017

(87) PCT Pub. No.: WO2018/017078
PCT Pub. Date: Jan. 25, 2018

(65) Prior Publication Data
US 2019/0219723 A1  Jul. 18, 2019

(51) Int. Cl.
*G01V 3/28* (2006.01)
*G01N 27/90* (2021.01)
(Continued)

(52) U.S. Cl.
CPC .......... *G01V 3/28* (2013.01); *G01N 27/9046* (2013.01); *G01N 27/9073* (2013.01); *G01R 33/02* (2013.01); *G01V 11/002* (2013.01)

(58) Field of Classification Search
None
See application file for complete search history.

(56) References Cited

U.S. PATENT DOCUMENTS 2,697,165 A * 12/1954 Blossey ................ H03H 2/005
455/197.1
4,292,589 A    9/1981 Bonner
(Continued)

FOREIGN PATENT DOCUMENTS

WO    2013190504 A1    12/2013

OTHER PUBLICATIONS

International Search Report and Written Opinion; PCT Application No. PCT/US2016/043163; dated Apr. 14, 2017.
(Continued)

*Primary Examiner* — Nasima Monsur
(74) *Attorney, Agent, or Firm* — Polsinelli PC (57) ABSTRACT

A system for reduced noise during remote field testing (RFT). The system, while moving an RFT probe through a structure: generates, RFT probe, a magnetic field. The system detects, at a detector solenoid on the RFT probe, a measured magnetic field which is the magnetic field modified by the presence of nearby pipe, and wherein the detector solenoid has a non-uniform solenoid response (i.e. a non-uniform turn density and/or cross sectional winding area) along a longitudinal axis extending from a one end of the detector solenoid to the opposite end of the detector solenoid. The system then identifies and measures pipe properties from an analysis of the measured magnetic field, via signal processing in conjunction with modeling.

10 Claims, 6 Drawing Sheets

(51) Int. Cl.
*G01R 33/02* (2006.01)
*G01V 11/00* (2006.01)

(56) References Cited

U.S. PATENT DOCUMENTS

| | | | |
|---|---|---|---|
| 5,210,492 A | 5/1993 | Hosohara et al. | |
| 5,461,312 A * | 10/1995 | Hosohara | G01N 27/902 |
| | | | 324/220 |
| 6,020,741 A * | 2/2000 | Heysse | G01V 3/28 |
| | | | 324/339 |
| 8,841,902 B2 | 9/2014 | Lysen et al. | |
| 8,884,614 B2 | 11/2014 | Wang et al. | |
| 8,958,989 B2 | 2/2015 | Legendre et al. | |
| 9,103,802 B2 | 8/2015 | Linder et al. | |
| 2008/0278157 A1 * | 11/2008 | Zimmerman | G01N 27/9033 |
| | | | 324/238 |
| 2009/0160449 A1 * | 6/2009 | Martinez | H01Q 1/04 |
| | | | 324/343 |
| 2011/0042073 A1 * | 2/2011 | Legendre | E21B 49/00 |
| | | | 166/250.01 |
| 2015/0127274 A1 * | 5/2015 | Legendre | E21B 47/082 |
| | | | 702/38 |
| 2015/0177191 A1 | 6/2015 | Hardy et al. | |
| 2016/0042841 A1 * | 2/2016 | Rodriguez Zermeno | H01B 12/02 |
| | | | 505/211 |

OTHER PUBLICATIONS

Office Action; Indonesian Application No. P00201810419; dated Sep. 17, 2019.
Extended European Search Report; European Application No. 16909672.4; dated Dec. 4, 2019.

\* cited by examiner

SHAPED SENSOR COIL FOR ATTENUATING MOTION-INDUCED NOISE DURING REMOTE FIELD TESTING OF PIPE

CROSS-REFERENCE TO RELATED APPLICATIONS

This application is a national stage entry of PCT/US2016/043,163 filed Jul. 20, 2016, said application is expressly incorporated herein in its entirety.

TECHNICAL FIELD

The present disclosure relates to remote field testing of pipe, and more specifically to reducing noise directed remote field testing.

BACKGROUND

For typical remote field testing of thick pipe, a low frequency magnetic field is generated by a transmit coil, then measured by the voltage induced on one or more receiver coils. When the coils are located near a magnetic pipe, the induced receiver voltage is altered by the presence of the pipe, such that analysis of the induced voltages detected can yield a measurement of pipe thickness, and can also identify areas with defects or metal loss. This kind of measurement is generally referred to as remote field testing (RFT), RFEC (remote field eddy current), or RFET (remote field electromagnetic technique). For long pipes, stationary measurements are not practical. Instead, measurements must be made while continuously moving, such that the entire length of the pipe can be measured in a reasonable amount of time. In many cases, movement along the pipe induces significant noise in the measurement which may be greater than the expected signal to be measured.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

A system, method and computer-readable storage devices are disclosed herein which help attenuate motion-induced noise during remote field testing of pipe. Pipe herein can include one or more types of tubulars provided in a wellbore, and can include, but is not limited to casings, tubing, production tubing, jointed tubing, coiled tubing, liners, combinations thereof, or the like. Wellbores are often provided with long extended portions containing pipe. Accordingly, testing of the pipe may be required at various times to determine properties of the piping, for example the presence or extent of corrosion, thickness, or other characteristics. As stated above, in practice for long pipes, stationary measurements are not practical. Instead, measurements must be made while continuously moving such that the entire length of the pipe can be measured in a reasonable amount of time. However, an undesired consequence may be the presence of noise in such measurements. In the oil industry, production casing (for well completions) can be many thousands of feet long. Continuous measurements at a rate of 5 ft/min (~1.5 m/min, 1 inch per second, or ~2-3 cm/s) or faster are generally required, with measurement coils located inside the innermost pipe. Moreover, production casing often has multiple concentric pipes, where the magnetic signals from the outer pipe are at very low levels.

Making the required measurements of magnetic fields from outer pipes while moving tends to be problematic because the low level signal to be measured tends to be corrupted by noise from small static magnetic fields contained in localized magnetized regions of the inner pipe. Although these static magnetic fields have no practical effect when making stationary measurements, they may present a substantial effect while moving.

As a receiver coil moves into and out of these static field regions, voltage is generated on the coil, which appears as noise on top of the desired measurement. In many cases, this "motion-induced noise" is not only the largest noise source, it can be greater than the expected signal to be measured—this is particularly true when attempting measurements of very thick or outermost pipe(s) which require very low frequency measurements.

In general, this kind of "motion-induced noise" appears over a broad frequency range, but in practice, it tends to exhibit a characteristic 1/f shape (it is higher as the frequency decreases). So the worst case highest noise generally coincides with the worst case lowest expected signal to measure (corresponding to the weakest signals from the outermost pipe), which may degrade the quality of measurement and/or force logging speeds to be reduced to achieve acceptable measurements.

The disclosed method, system, and computer-readable storage devices significantly reduce the noise voltage associated with moving through static magnetized regions of pipe by modifying the shape of the receiver antenna coil.

The typical equation governing induced voltage on a coil comes from Faraday's Law:

$$\varepsilon = -A*N*d\Phi_B/dt \qquad \text{Equation 1}$$

For a coil with N identical turns and a cross sectional area A, where $\Phi_B$ is magnetic flux, Equation 1 yields an induced voltage ε. The induced voltage is proportional to the change in magnetic flux per unit of time.

In the case of an oil-industry corrosion evaluation and monitoring tool, because the signals being measured are very weak, coils with thousands of turns are required to detect the weak signals. Because receiver coils must fit inside a narrow diameter pipe, coils are constrained to a small outer diameter. This naturally results in coils which are much longer than they are wide—for example, a length of ~8 inches (~20-21 cm), and a diameter of ~1 inch (~2-3 cm).

From experimental data, it is observed that the localized static magnetized regions can randomly vary in size, and by wide margins. These can be very small (less than one inch, or less than 2-3 cm) or much larger (multiple feet or meters) or any distance in-between. It is reasonable to believe that some lengths of magnetization will tend to be more problematic than others. To find a useful trend in this regard, the optimal size of a magnetized region for generating noise is determined.

For this analysis, lowest excitation frequency (and therefore lowest and most critical frequency of interest) for measuring an outer pipe is fixed to a certain frequency such as ~1 Hz. Additionally, the assumed speed is set to ~1 inch (~2-3 cm) per second (5 ft/min, ~1.5 m/min). Both factors are exemplary only, and will change to the specific circumstances of the pipe/structure being analyzed. Given a 1 Hz frequency and ~1 inch/s (~2-3 cm/s) speed, there will exist a small magnetized region which has a length which is optimal for generating noise at exactly the frequency of interest; this length will be small—somewhere around ~1 inch (~2-3 cm). In practice, the identification of this optimal region length can be approximated.

This noise at the lowest frequency of interest is the most difficult noise to filter out, and hence represents the "worst case," and also represents where improved performance is most needed. Therefore, efforts can be focused on reducing noise effects from the identified region length—in this example, the small ~1 inch (~2-3 cm) magnetized regions.

For a small magnetized region, only a small part of the coil will "see" the static field resulting from structural defects in the pipe at any given time because the length of the receiver coil is much longer than the length of the magnetized region. Therefore, the voltage generated (which may include noise) can be considered to be proportional to turn density (turns per inch, centimeter, or any other point of measurement) over the static magnetized region. Because of this proportional relationship, N (the number of turns) in Equation 1 can be replaced with n (turn density), resulting in:

$$\varepsilon = -A*n*d\Phi_B/dt \qquad \text{Equation 2}$$

Moreover, because at issue is a static magnetized region (rather than a time varying magnetic field) where the coils are moving over the magnetized region, the magnetic flux $\Phi_{DBs}$ can be substituted in thereby indicating a static field. Faraday's equation can then be rearranged to match the situation as described (of coils passing over a stationary magnetic field). The new rearranged equation shows that the voltage generated is proportional to the change of turn density times area (through the static field) per unit time:

$$\varepsilon = -\Phi_{Bs}*d(A*n)/dt \qquad \text{Equation 3}$$

In Equation 3, the change of turn density times area per unit time, d(A*n)/dt, is proportional to the velocity of the coil as the coil moves from a non-magnetized region into a magnetized region. For a typical helical coil in a solenoid, there may be thousands of turns of equal area which are equally distributed over the length of the coil, such that beyond either end of the coil (that is, beyond the helical coil), the turn density is zero, and inside the coil ends the turn density is uniformly high. Likewise, referring to Equation 3, the change in coil density within the equally distributed coil is zero (because the coil is equally distributed).

Given the above considerations, two useful generalizations herein can be made regarding the nature of induced noise from a ~1" (~2-3 cm)×8" (~20-21 cm) coil moving through a small ~1 inch (~2-3 cm) magnetized region at a constant velocity of ~1 inch/s (~2-3 cm/s): (1) The highest induced noise voltage can be expected to occur as the end of the coil passes into or out of the small magnetized region corresponding to a pipe defect because this is the region with the highest dn/dt; and (2) While the small magnetized region is located near the center of the coil, there is little or no induced noise voltage, because dn/dt is (ideally) zero (as long as the velocity is constant).

Figure 1:
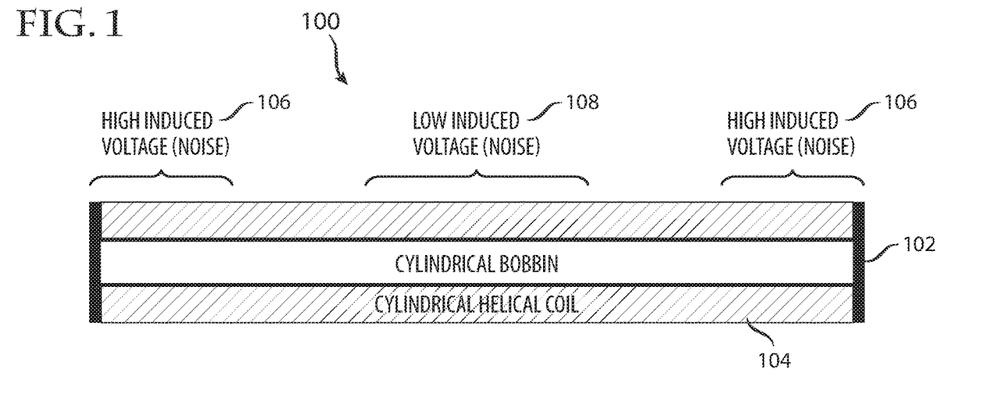
FIG. 1 illustrates an exemplary standard solenoid.

The above two observations are further represented in FIG. 1, where the receiver coil 100 is a standard solenoid having a cylindrical bobbin 102 and a cylindrical helical coil of wire 104 wrapped around the cylindrical bobbin 102. The annotations in FIG. 1 note the relatively high induced noise voltage 106 on the edges of the coil 104 and the relatively low induced noise voltage 208 in the middle of the coil 104.

In view of the above, there are a number of advantages to receiver antenna coil designs with a non-uniform solenoid response where the effective turn density multiplied by effective cross sectional winding area varies over the length of the receiver/detector coil. For example, in one example receiver coil, the turn density is low near the ends, and gradually increases towards the middle. The gradual increase of turn density x area produces reduced voltage from static magnetized regions.

An exemplary method for using the receiver antenna coils as disclosed herein is: while moving a remote field testing (RFT) probe through a structure: generating, on the probe, a magnetic field; and detecting, at a detector solenoid on the remote field testing probe, measured magnetic field which is the magnetic field modified by the presence of nearby pipe, and wherein the detector solenoid has a non-uniform solenoid response (i.e. a non-uniform turn density and/or cross sectional winding area) along a longitudinal axis extending from a first end of the detector solenoid to an opposite end of the detector solenoid; and identifying and measuring pipe properties of interest from an analysis of the measured magnetic field, via signal processing in conjunction with modeling.

Figure 2:
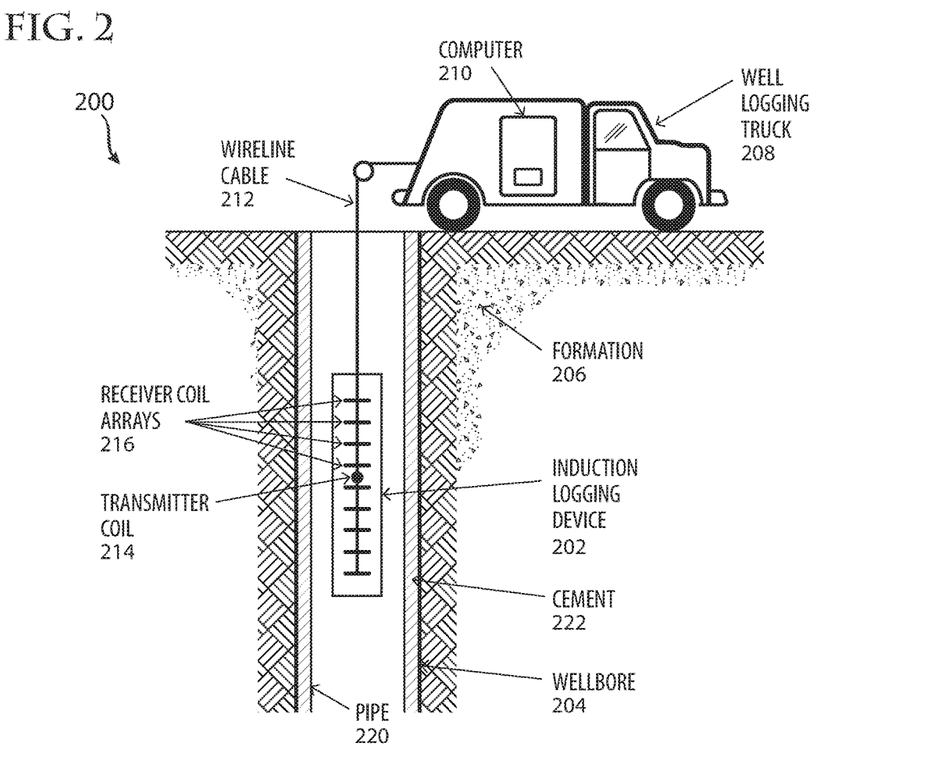
FIG. 2 illustrates an example wireline embodiment.

The disclosure now turns to FIG. 2. FIG. 2 illustrates an illustrative wireline logging system 200, where an RFT probe containing the "transmit coil" and one or more "receive coils" is fed through a structure to detect defects. The transmit coil itself could be used as a receive coil depending on the desired system configuration.

As shown, the wireline logging system 200 comprises an induction logging device 202 disposed in a wellbore 204 which penetrates a formation 206. The wellbore 204 can include a pipe 220, also referred to as a casing, which can be cemented into place in at least a portion of the wellbore 204 by cement 222. The pipe 220 may include multiple layers of concentric pipes with inner outer pipes. The induction logging device 202 is connected by a wireline cable 212 to a well-logging truck 208 located at the rig site. The wireline cable provides power to the induction logging device 202 and is used to transmit measurements taken from the device to the well-logging truck 208. The well-logging truck 208 contains a computer 210 that receives the measurements, preferably stores the measurements, and utilizes the measurements identify defects within the pipe 204.

The induction logging device 202 may include a transmitter coil 214 and one or more receiver coil arrays 216 attached to a support. Although not specially shown, each receiver coil array 216 may include a main coil and a bucking coil connected in series. The bucking coil is designed to remove any direct coupling between the transmitter coil 214 and the main coil.

The illustrated wireline conveyance 200 can provide support for the tool, as well as enabling communication between the tool processors on the surface outside the wellbore 204 and providing a power supply. The wireline conveyance 200 can include any downhole conveyance such as wire, cable, e-line, slickline, braided line, metallic wire, non-metallic wire, or composite wire, single or multiple strands, as well as tubing, coiled tubing, joint tubing, pipe, or other tubular, combinations thereof, and the like. The wireline conveyance 200 can include fiber optic cabling for carrying out communications. The optical cable can be provided internal or external of the conveyance 200. The wireline conveyance 200 is sufficiently strong and flexible to tether the downhole tool unit through the wellbore 204, while also permitting communication through the wireline conveyance 200 to surface tools unit, such as the well logging truck 208.

The induction logging 202 device may be lowered 202 within the wellbore 204 and pipe 220 at any speed suitable for the particular environment and circumstance. However, as examples, the induction device 202 may below lowered at a rate of from ~0.5 inches (~1-2 cm) per second to ~5 inches (12-13 cm) per second, or alternatively from ~1 inch (~2-3 cm) per second to ~3 inches (7-8 cm) per second, or alternatively may be lowered at a rate of at least ~1 inch (~2-3 cm) per second, or may be any of the aforementioned or between such ranges.

FIGS. 3-10 illustrate various examples of solenoids configured according to this disclosure, where each example solenoid has a helical coil of wire wound around a bobbin/spindle. In each of these examples, either the bobbin, the helical coil, or both the bobbin and the helical coil have a non-uniform shape, resulting in a receiver coil which, when moving at a constant rate through a structure, results in noise-suppression while detecting defects within the structure. These and other various embodiments of the disclosure are described in detail below. While specific implementations are described, it should be understood that this is done for illustration purposes only. Other components and configurations may be used without parting from the spirit and scope of the disclosure.

While specific dimensions are mentioned as examples below, general exemplary dimensions include for example that the length of a coil may range from ~6 inches (15-16 cm) to ~15 inches (~38-39 cm), or alternatively range from ~8 inches (~20-21 cm) to ~12 inches (30-31 cm), or alternatively range from ~8 inches (~20-21 cm) to ~10 inches (~25-26 cm), or may any of the aforementioned or between such ranges. The circumference is less than the length of the coil and may range from ~0.5 inch (~1-2 cm) to ~5 inches (~12-13 cm), or alternatively from ~1 inch (~2-3 cm) to ~3 inches (~7-8 cm), or may be any of the aforementioned or between such ranges.

The exemplary dimensions provided below are intended to provide examples of how the shape of the non-uniform helical coils can be formed. Accordingly, although specific dimensions are mentioned, the principles apply equally and correspondingly to other lengths and circumferences so as to achieve the described shapes. While these exemplary dimensions provided are intended to clarify the illustrated examples of FIGS. 3-10, it should again be understood that such dimensions are provided for illustration purposes only, and other dimensions may be used without parting from the spirit and scope of the disclosure.

Figure 3:
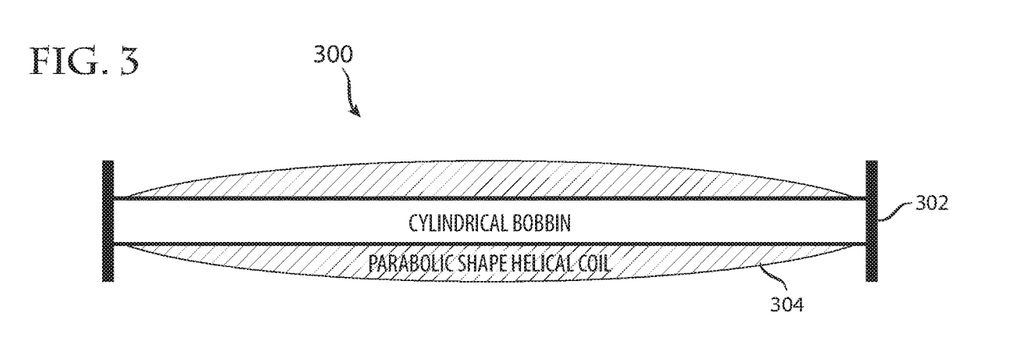
FIG. 3 illustrates an exemplary solenoid with a cylindrical bobbin and parabolic shaped helical coil.

FIG. 3 illustrates a receiver coil 300 with a cylindrical bobbin 302 and a parabolic shaped coil 304 (also known as a paraboloid). The precise shape of the parabolic shaped coil 304 and the cylindrical bobbin 302 can vary. For example, the cylindrical bobbin 302 can be approximately cylindrical, where the actual shape is (if precisely measured) elliptical, but is within a threshold/tolerance range to a cylinder. Regarding the parabolic shaped coil 304, the precise shape of the parabolic shaped coil 304 can vary based on specific configurations. In some configurations, the helical coil 304 can come to a vertex, with the amount of coil increasing and decreasing on either side of the vertex. For example, if the solenoid were 8 inches (~20-21 cm) long, and the vertex circumference were 2 inches (~5 cm), the helical coil might start on one end of the bobbin, increasing quadratically from a circumference of 1 inch (~2-3 cm) to 2 inches (~5 cm) over a 4 inch (~10 cm) span, then immediately begin decreasing quadratically from 2 inches (~5 cm) back down to 1 inch (~2-3 cm) for the second 4 inch (~10 cm) span. Although 8 inches (~20-21 cm) long In such a configuration, the solenoid/receiver coil 300 can be considered to have two symmetrical portions, where each portion has a non-uniform solenoid response (i.e. a non-uniform turn density and/or cross sectional winding area) moving along the longitudinal axis of the bobbin.

In other configurations, the "vertex" can be a portion/section of the solenoid, with portions increasing and decreasing on either side. For example, the 8 inch (~20-21 cm) solenoid may increase quadratically from 1 inch (~2-3 cm) circumference to 2 inches (~5 cm) over a 2 inch (~5 cm) span, remain at 2 inches (~5 cm) circumference for 4 inches (~10 cm), then decrease in circumference from 2 inches (~5 cm) to 1 inch (~2-3) cm over the final 2 inch (~5 cm) span. The precise coefficients controlling how fast/slow the amount of helical coil changes can vary based on specific circumstances and implementation details.

Figure 4:
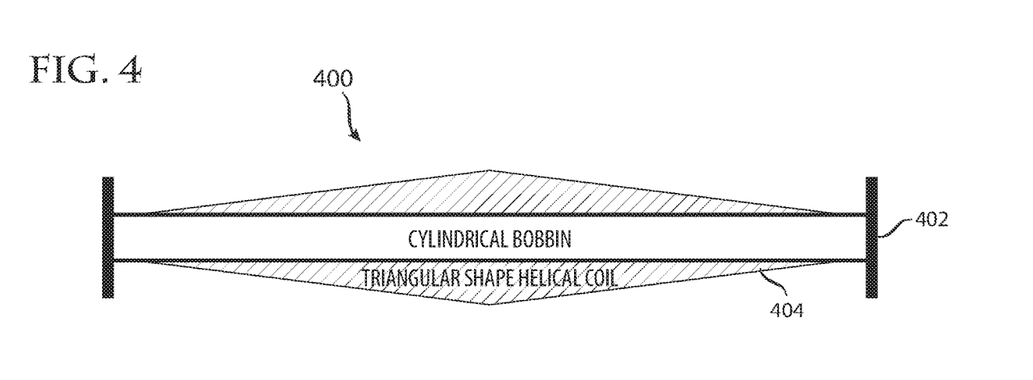
FIG. 4 illustrates an exemplary solenoid with a cylindrical bobbin and a triangular shaped helical coil.

FIG. 4 illustrates a receiver coil 400 with a cylindrical bobbin 402 and a triangular shaped coil 404. As in FIG. 3, the precise shape of the bobbin 402 can vary. However, with a triangular shaped helical coil 404, the rate at which the density changes is constant for a respective portion. Thus, as illustrated, the amount of coiling increases at a constant rate until reaching the desired coil circumference (at an apex), then decreases at a constant rate until reaching the end of the bobbin 302. As illustrated, the halves of the receiver coil 400 are symmetrical. However, in various configurations (in this, and all other example receiver coils illustrated or described herein), the respective portions of the receiver coil 400 can be asymmetric. Thus, in an exemplary solenoid which is 8 inches (~20-21 cm) long and increasing from 1 inch (~2-3 cm) helical coil circumference to 2 inches (~5 cm) helical coil circumference, then back down to 1 inch (~2-3 cm), the respective potions can be symmetrical (for example, a 4 inch (~10 cm) increasing circumference, and a 4 inch (~10 cm) decreasing circumference), or can be asymmetrical (for example, 1 inch (~2-3 cm) increasing, 7 inches (~17-18 cm)

decreasing). Thus, in a symmetrical configuration, the rate of density increasing will be constant until reaching the apex and will match the rate of density decreasing, which is likewise constant until reaching the end of the bobbin. In an asymmetrical configuration, the rate of density increasing will be constant until reaching the apex, but will differ from the rate of density decreasing, which is similarly constant until reaching the end of the bobbin.

Figure 5:
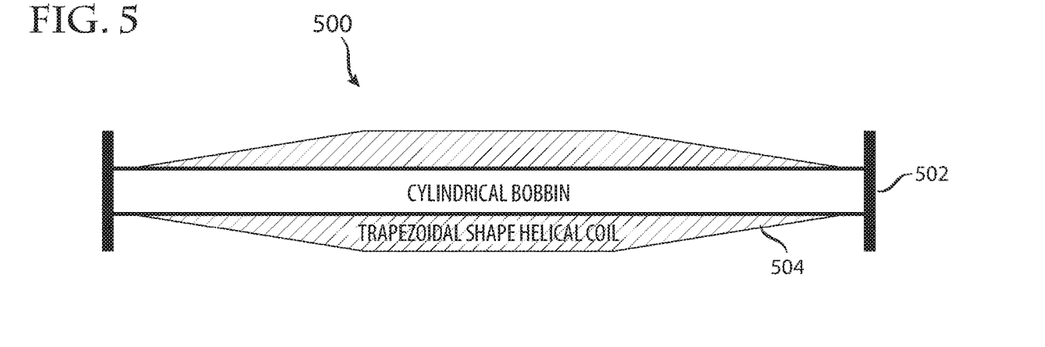
FIG. 5 illustrates an exemplary solenoid with a cylindrical bobbin and a trapezoidal shaped helical coil.

FIG. 5 illustrates a receiver coil 500 with a cylindrical bobbin 502 and a trapezoidal shaped coil 504. The precise shape of the bobbin 502 can vary. As with a triangular shaped helical coil (described above), the rates of increasing/decreasing helical coil density are constant with respect to each portion of the trapezoidal helical coil 504. However, whereas the triangular shaped helical coil 404 increases until reaching an apex, then immediately begins decreasing, the trapezoidal shaped helical coil 504 reaches a maximum circumference and remains at that level for a portion of the solenoid before decreasing. Thus for example, in a 10 inch (~25-26 cm) receiver coil having a symmetrical trapezoidal shaped helical coil varying between 1 inch (~2-3 cm) circumference and 3 inch (~7-8 cm) circumference, the circumference could increase (along a longitudinal direction of the bobbin) constantly from 1 inch (~2-3 cm) to 3 inch (~7-8 cm) over a 3 inch (~7-8 cm) span, then remain at 3 inch (~7-8 cm) circumference for a 4 inch (~10' cm) span of the bobbin, then decrease constantly from 3 inch (~7-8 cm) to 1 inch (~2-3 cm) over the final 3 inch (~7-8 cm)span of the bobbin.

In each of the exemplary receiver coils of FIGS. 3, 4, and 5, the shape of the bobbin is constant using a cylindrical form with the density of the solenoid being made non-uniform by varying the circumference of the coils along the longitudinal axis of the bobbin. Another way to create a solenoid having a non-uniform coil density is to modify the bobbin to have a non-cylindrical shape. Such configurations can be advantageous because machines winding the coil can wind the coil until a cylindrical outside circumference is achieved, while the inside circumference is not cylindrical. Examples of such configurations are provided in FIGS. 6, 7, 8, and 9.

Figure 6:
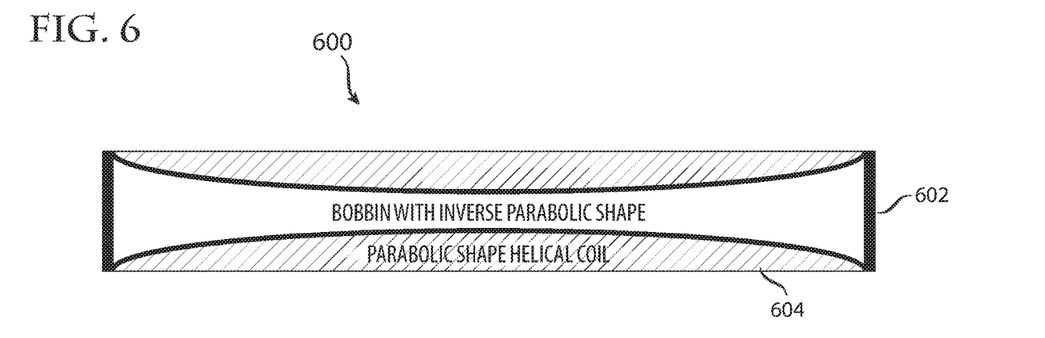
FIG. 6 illustrates an exemplary solenoid with an inverse parabolic shaped bobbin and a parabolic shaped helical coil.

FIG. 6 illustrates a receiver coil 600 with an inverse parabolic shaped bobbin 602 and a parabolic shaped coil 504. The shape of the bobbin 602 is referred to as "inverse parabolic" because the width/circumference of the bobbin 602 is largest at the ends and smallest in the middle. As described above (in FIG. 3), the precise rates of increase/decrease can vary, so long as the rates are quadratic in nature. In addition, and similar to FIG. 3, the bobbin 602 can have a portion in the middle which is constant (i.e., not increasing or decreasing in width/circumference). The helical coil 604 is parabolically shaped, increasing quadratically from one end of the receiver coil 600 to a larger circumference in the middle of the receiver coil, then decreasing quadratically to the other end of the receiver coil. The parabolic shape of the helical coil 604 and the inverse parabolic shape of the bobbin 602 fit together to form a cylindrical shaped receiver coil, where the solenoid 600 appears to be a normal cylindrical receiver coil. However, because of the varying bobbin/coil circumferences, the density of the coils is non-uniform along the longitudinal axis of the receiver coil 600. One possible advantage of such a configuration is that winding machines can easily be adapted to create cylindrical shaped receiver coils with bobbins of non-uniform circumference.

Figure 7:
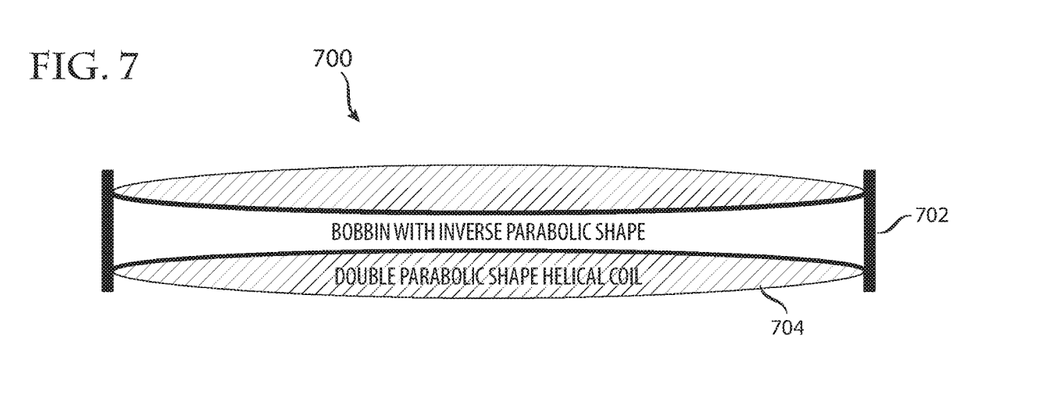
FIG. 7 illustrates an exemplary solenoid with an inverse parabolic shaped bobbin and a double parabolic shaped helical coil.

FIG. 7 illustrates a receiver coil 700 with an inverse parabolic shaped bobbin 702 and a double parabolic shaped helical coil 704. This example 700 has similarities to both FIG. 6 and FIG. 3. However, the helical coil 704 is considered double parabolic because both the internal circumference and the external circumferences of the helical coil increase/decrease quadratically along the longitudinal axis of the bobbin 702.

Figure 8:
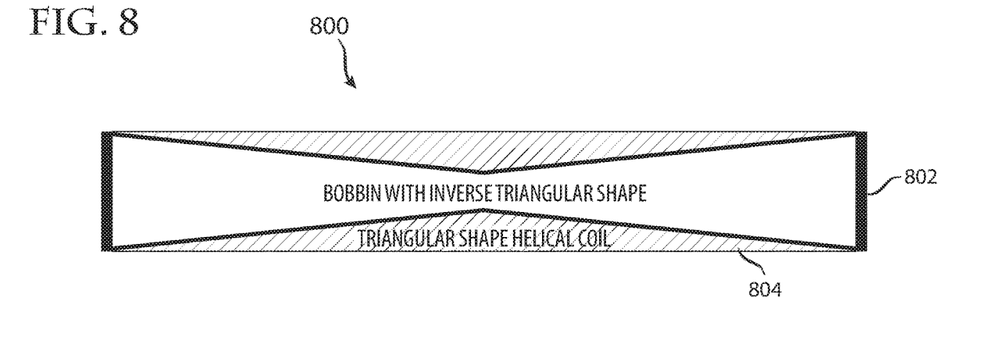
FIG. 8 illustrates an exemplary solenoid with an inverse triangular shaped bobbin and a triangular shaped helical coil.

FIG. 8 illustrates a receiver coil 800 with an inverse triangular shaped bobbin 802 and a triangular shaped helical coil 804. This example 800 has similarities to both FIG. 4 and FIG. 6. Specifically, while the outside circumference of the helical coil 804 forms a cylinder, the inside circumference of the helical coil 804 matches the inverse triangular shape of the bobbin 802, forming a triangular shaped helical coil 804, where the amount of coil increases at a constant rate (along the longitudinal axis of the bobbin 802) to the apex, then decreases at a constant rate in the same direction along the longitudinal axis until the end of the bobbin.

Figure 9:
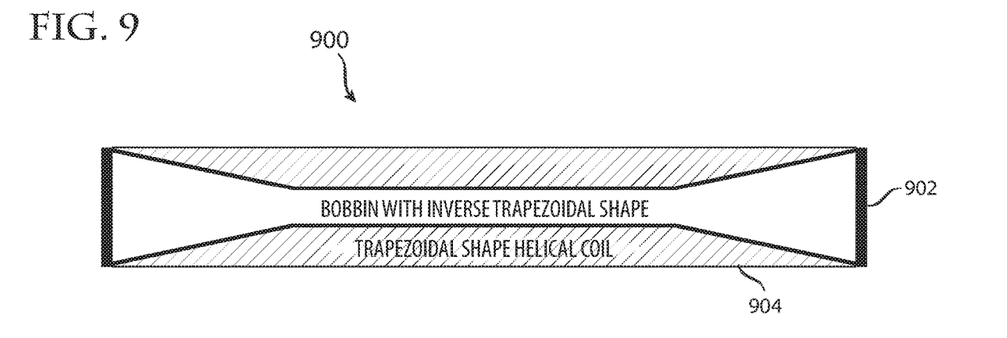
FIG. 9 illustrates an exemplary solenoid with an inverse trapezoidal shaped bobbin and a trapezoidal shaped helical coil.

FIG. 9 illustrates a receiver coil 900 where the bobbin 902 has an inverse trapezoidal shape and the helical coil 904 has a trapezoidal shape, forming an overall cylindrical shaped receiver coil. This example is very similar to the example receiver coil of FIG. 6, with a difference being that rather than increasing and decreasing the widths/circumferences quadratically, the widths of both the bobbin and the helical coil are varied at constant rates.

Figure 10:
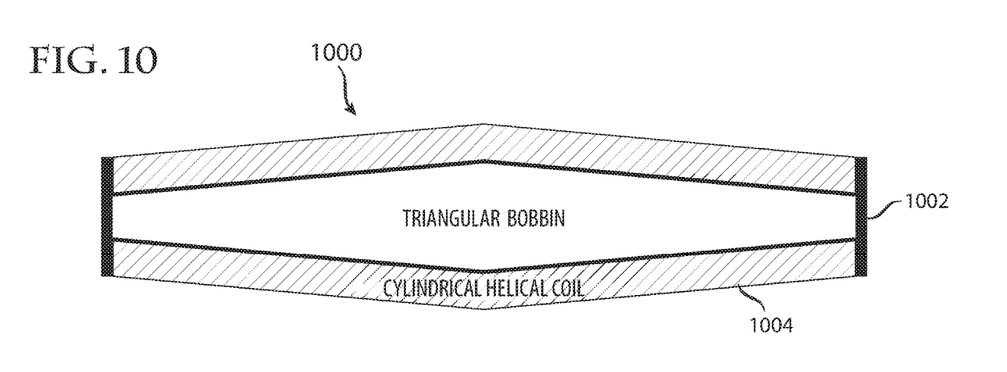
FIG. 10 illustrates an exemplary solenoid with a triangular parabolic shaped bobbin and a cylindrical shaped helical coil.

FIG. 10 illustrates a receiver coil 1000 having a triangular shaped bobbin 1002 and a cylindrical helical coil 1004. The shape of the bobbin 1002 is referred to as "triangular" because it increases in circumference from one end of the bobbin to an apex at a constant rate, then decreases in circumference from the apex to the other end of the bobbin at a constant rate. The shape of the helical coil 1004 is referred to as "cylindrical" because the amount/density of coils wound over the bobbin 1002 is constant, despite the resulting shape of the receiver coil 1000 being triangular due to the bobbin 1002.

While not illustrated, other configurations of bobbins and helical coils can include asymmetrical receiver coils, where one end of the receiver coil has a circumference distinct from the other end of the receiver coil. In another configuration, the receiver coil can use parabolically shaped bobbins, where the bobbin is configured to increase quadratically along the longitudinal axis to a middle point, then decrease quadratically along the longitudinal axis to the other end of the bobbin. Yet another configuration can mix use of quadratic and linear/constant changes in helical coil density. For example, one portion of the solenoid can use a bobbin which varies constantly to a middle location, then remains cylindrical for the remainder portion of the bobbin. Another example could have one portion of the solenoid use a bobbin which changes circumference at a constant rate to a middle location, then changes quadratically over the remainder potion of the bobbin. Similar variations in the helical coil can likewise be used, where one portion of the helical coil is cylindrical, changes linearly, changes quadratically, etc., and a second portion of the helical coil changes in a distinct way.

Yet other receiver coil configurations can utilize a "step" function design, where rather than changing the density of the bobbin or helical in a gradual (i.e., linear or quadratically), the density changes in a step function. Such step receiver coil configurations can be asymmetrical or symmetrical, and can also be mixed with the gradual density changes described above.

With respect to a non-uniform solenoid response (i.e. non uniform turn density and/or non-uniform winding area) along the longitudinal axis extending from one end of a bobbin/spindle to the opposite end of the bobbin, there are three primary ways to create a non-uniform solenoid response: (1) Use a bobbin with non-uniform circumference in the longitudinal direction, and deliberately wrap windings to achieve a uniform circumference; (2) Wrap the helical coil around the bobbin such that the amount of coil wrapped varies at distinct points in the longitudinal axis, resulting in a non-uniform outer wire circumference; and (3) Vary the gauge of the wire as the wire is being coiled around the bobbin. Of course, these methods may be used in combination. Variations in the bobbin and helical coil are discussed above. The disclosure now turns to a discussion of varying gauge wire.

Most solenoids are constructed using coiled wire which is a constant gauge, meaning the diameter of the wire remains constant. However, one could also create a non-uniform solenoid response by using a wire with varying gauge such that the turn density changes in proportion to the wire diameter. For example, the helical coil which is being wrapped around the bobbin could vary over its length from a heavy gauge to a light gauge and back again.

Figure 11:
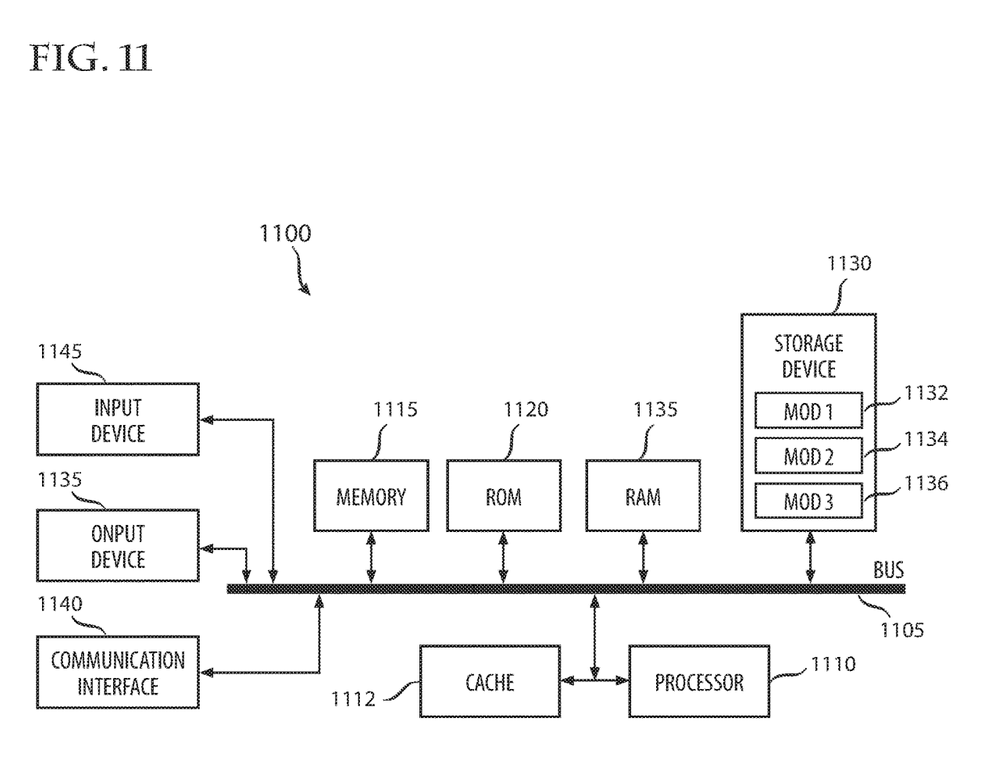
FIG. 11 illustrates an exemplary computer system.

With reference to FIG. 11, an exemplary system 1100 includes a general-purpose computing device 1100, including a processing unit (CPU or processor) 1120 and a system bus 1110 that couples various system components including the system memory 1115 such as read only memory (ROM) 1120 and random access memory (RAM) 1135 to the processor 1110. The system 1100 can include a cache 1112 of high speed memory connected directly with, in close proximity to, or integrated as part of the processor 1110. The system 1100 copies data from the memory 1115 and/or the storage device 1130 to the cache 1112 for quick access by the processor 1110. In this way, the cache provides a performance boost that avoids processor 110 delays while waiting for data. These and other modules can control or be configured to control the processor 1110 to perform various actions. Other system memory 1115 may be available for use as well. The memory 1115 can include multiple different types of memory with different performance characteristics. It can be appreciated that the disclosure may operate on a computing device 1100 with more than one processor 1110 or on a group or cluster of computing devices networked together to provide greater processing capability. The processor 1100 can include any general purpose processor and a hardware module or software module, such as module 1 1132, module 2 1134, and module 3 1136 stored in storage device 1130, configured to control the processor 1110 as well as a special-purpose processor where software instructions are incorporated into the actual processor design. The processor 1100 may essentially be a completely self-contained computing system, containing multiple cores or processors, a bus, memory controller, cache, etc. A multi-core processor may be symmetric or asymmetric.

The system bus 1105 may be any of several types of bus structures including a memory bus or memory controller, a peripheral bus, and a local bus using any of a variety of bus architectures. A basic input/output (BIOS) stored in ROM 1120 or the like, may provide the basic routine that helps to transfer information between elements within the computing device 1100, such as during start-up. The computing device 1100 further includes storage devices 1130 such as a hard disk drive, a magnetic disk drive, an optical disk drive, tape drive. The storage device 1130 can include software modules 1132, 1134, 1136 for controlling the processor 1110. Other hardware or software modules are contemplated. The storage device 1130 is connected to the system bus 1105 by a drive interface. The drives and the associated computer-readable storage media provide nonvolatile storage of computer-readable instructions, data structures, program modules and other data for the computing device 1100. In one aspect, a hardware module that performs a particular function includes the software component stored in a tangible computer-readable storage medium in connection with the necessary hardware components, such as the processor 1110, bus 1105, display 1135, communication interface 1140, and so forth, to carry out the function. In another aspect, the system can use a processor and computer-readable storage medium to store instructions which, when executed by the processor, cause the processor to perform a method or other specific actions. The basic components and appropriate variations are contemplated depending on the type of device, such as whether the device 1100 is a small, handheld computing device, a desktop computer, or a computer server.

Although the exemplary embodiment described herein employs the hard disk 1130, other types of computer-readable media which can store data that are accessible by a computer, such as magnetic cassettes, flash memory cards, digital versatile disks, cartridges, random access memories (RAMs) 1135, read only memory (ROM) 112, a cable or wireless signal containing a bit stream and the like, may also be used in the exemplary operating environment. Tangible computer-readable storage media, computer-readable storage devices, or computer-readable memory devices, expressly exclude media such as transitory waves, energy, carrier signals, electromagnetic waves, and signals per se.

To enable user interaction with the computing device 1100, an input device 1145 represents any number of input mechanisms, such as a microphone for speech, a touch-sensitive screen for gesture or graphical input, keyboard, mouse, motion input, speech and so forth. An output device 1135 can also be one or more of a number of output mechanisms known to those of skill in the art. In some instances, multimodal systems enable a user to provide multiple types of input to communicate with the computing device 1100. The communications interface 1140 generally governs and manages the user input and system output. There is no restriction on operating on any particular hardware arrangement and therefore the basic features here may easily be substituted for improved hardware or firmware arrangements as they are developed.

For clarity of explanation, the illustrative system embodiment is presented as including individual functional blocks including functional blocks labeled as a "processor" or processor 1110. The functions these blocks represent may be provided through the use of either shared or dedicated hardware, including, but not limited to, hardware capable of executing software and hardware, such as a processor 1110, that is purpose-built to operate as an equivalent to software executing on a general purpose processor. For example the functions of one or more processors presented in FIG. 11 may be provided by a single shared processor or multiple processors. (Use of the term "processor" should not be construed to refer exclusively to hardware capable of executing software.) Illustrative embodiments may include microprocessor and/or digital signal processor (DSP) hardware, read-only memory (ROM) 1120 for storing software performing the operations described below, and random access memory (RAM) 1135 for storing results. Very large scale integration (VLSI) hardware embodiments, as well as custom VLSI circuitry in combination with a general purpose DSP circuit, may also be provided.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. The system 1100 shown in FIG. 11 can practice all or part of the recited methods, can be a part of the recited systems, and/or can operate according to instructions in the recited tangible computer-readable storage media. Such logical operations can be implemented as modules configured to control the processor 1110 to perform particular functions according to the programming of the module. For example, FIG. 11 illustrates three modules Mod1 1132, Mod2 1134 and Mod3 1136 which are modules configured to control the processor 1110. These modules may be stored on the storage device 1130 and loaded into RAM 1135 or memory 1115 at runtime or may be stored in other computer-readable memory locations.

Figure 12:
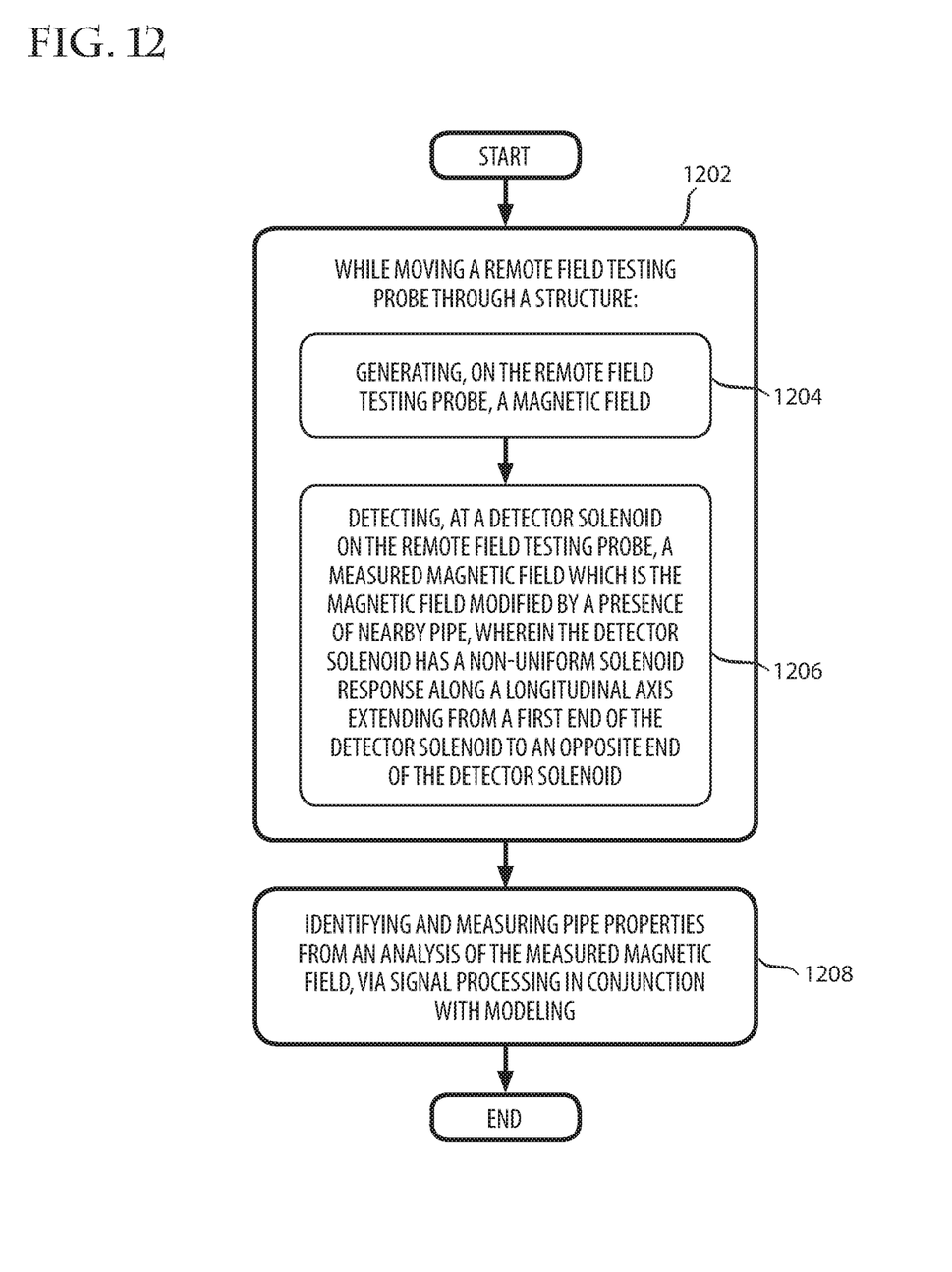
FIG. 12 illustrates an example method embodiment.

Having disclosed some basic system components and concepts, the disclosure now turns to the exemplary method embodiment shown in FIG. 12. For the sake of clarity, the method is described in terms of an exemplary system 1100 as shown in FIG. 11 configured to practice the method. The steps outlined herein are exemplary and can be implemented in any combination thereof, including combinations that exclude, add, or modify certain steps.

The system 1100, while moving an remote field testing probe through a structure (such as a pipe) (1202): generates, on the remote field testing probe, a magnetic field (1204). The magnetic field generation can occur at a transmit coil 114, such as that illustrated in FIG. 1. The system 1100 then detects, at a detector/receiver solenoid on the remote field testing probe, a measured magnetic field, which is the magnetic field modified by the presence of nearby pipe, and wherein the detector solenoid has a non-uniform solenoid response (i.e. non-uniform turn density and/or winding area area) along a longitudinal axis extending from a first end of the detector solenoid to an opposite end of the detector solenoid (1206). The system 1100 then identifies and/or measures pipe properties of interest from an analysis of the measured magnetic field, via signal processing in conjunction with modeling (1208).

Embodiments within the scope of the present disclosure may also include tangible and/or non-transitory computer-readable storage media for carrying or having computer-executable instructions or data structures stored thereon. Such tangible computer-readable storage media can be any available media that can be accessed by a general purpose or special purpose computer, including the functional design of any special purpose processor as described above. By way of example, and not limitation, such tangible computer-readable media can include RAM, ROM, EEPROM, CD-ROM or other optical disk storage, magnetic disk storage or other magnetic storage devices, or any other medium which can be used to carry or store desired program code means in the form of computer-executable instructions, data structures, or processor chip design. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

The various embodiments described above are provided by way of illustration only and should not be construed to limit the scope of the disclosure. For example, the principles herein apply to both downhole and above ground structural testing of pipes and other RFT probe testing. Various modifications and changes may be made to the principles described herein without following the example embodiments and applications illustrated and described herein, and without departing from the spirit and scope of the disclosure.

Statements of the disclosure include:

Statement 1: A method comprising: providing a remote field testing probe in a wellbore containing pipe; generating a magnetic field on the remote field testing probe while the remote field testing probe is moving; detecting, at a detector solenoid on the remote field testing probe, a measured magnetic field which is the magnetic field modified by a presence of the pipe, wherein the detector solenoid has a non-uniform solenoid response along a longitudinal axis extending from a first end of the detector solenoid to an opposite end of the detector solenoid; and determining properties of the pipe using the measured magnetic field via signal processing in conjunction with modeling.

Statement 2: The method of Statement 1, wherein the non-uniform solenoid response comprises one of: (1) a first portion of the detector solenoid having a number of turns per longitudinal length different from a second portion of the detector solenoid and/or (2) the first portion of the detector solenoid having a cross sectional winding area which is distinct from that of the second portion of the detector solenoid.

Statement 3: The method of Statement 1 or Statement 2, wherein the detector solenoid comprises a bobbin, the bobbin having a plurality of bobbin portions, wherein a first portion in the plurality of bobbin portions has a first shape which is distinct, using a longitudinal perspective along the longitudinal axis, from a second shape of a second portion in the plurality of bobbin portions.

Statement 4: The method of any of the preceding Statements, wherein the detector solenoid comprises a helical coil, the helical coil having a plurality of helical coil portions, wherein a first portion in the plurality of helical coil portions has a first shape which is distinct, using a longitudinal perspective along the longitudinal axis, from a second shape of a second portion in the plurality of helical coil portions.

Statement 5: The method of any of the preceding Statements, wherein: the detector solenoid comprises a bobbin and a helical coil; the helical coil has a plurality of helical coil portions, wherein a first helical coil portion in the plurality of helical coil portions has a first solenoid shape which is distinct, using a longitudinal perspective along the longitudinal axis, from a second solenoid shape of a second solenoid portion in the plurality of helical coil portions; and the bobbin has a plurality of bobbin portions, wherein a first bobbin portion in the plurality of bobbin portions has a first bobbin shape which is distinct, using the longitudinal perspective along the longitudinal axis, from a second bobbin shape of a second bobbin portion in the plurality of bobbin portions.

Statement 6: The method of any of the preceding Statements, wherein the detector solenoid comprises a bobbin and a helical coil, wherein at least one of the bobbin and the helical coil has a shape from a list comprising: a cylinder shape, a hyperboloid shape, an inverse hyperboloid shape, a triangular shape, an inverse triangular shape, an increasing step shape, a decreasing step shape, a symmetrical step shape, an asymmetrical step shape, a trapezoidal shape, an inverse trapezoidal shape, a parabolic funnel shape, a double parabolic shape, and a step funnel shape.

Statement 7: The method of any of the preceding Statements, wherein the bobbin and the helical coil are not both the cylinder shape.

Statement 8: The method of any of the preceding Statements, wherein the non-uniform solenoid response is caused by varying, along the longitudinal axis, a gauge of solenoid wire.

Statement 9: The method of any of the preceding Statements, wherein the non-uniform solenoid response is caused by varying, along the longitudinal axis, a spacing between subsequent solenoid coils.

Statement 10: The method of any of the preceding Statements, wherein the structure is a pipe.

Statement 11: A system comprising: a remote field testing probe comprising a detector solenoid, wherein the detector solenoid has a non-uniform solenoid response along a longitudinal axis extending from a first end of the detector solenoid to an opposite end of the detector solenoid; a processor; and a computer-readable storage medium having instructions stored which, when executed by the processor, cause the processor to perform operations comprising: causing the remote field testing probe to generate a magnetic field as the remote field testing probe moves; receiving a measured magnetic field from the remote field testing probe, wherein the measured magnetic field is the magnetic field modified by a presence of nearby pipe; and determining pipe properties from the measured magnetic field.

Statement 12: The system of Statement 11, wherein the non-uniform solenoid response comprises one of: (1) a first portion of the detector solenoid having a number of turns per longitudinal length different from a second portion of the detector solenoid and/or (2) the first portion of the detector solenoid having a cross sectional winding area which is distinct from that of the second portion of the detector solenoid.

Statement 13: The system of Statement 11 or 12, wherein the detector solenoid comprises a bobbin, the bobbin having a plurality of bobbin portions, wherein a first portion in the plurality of bobbin portions has a first shape which is distinct, using a longitudinal perspective along the longitudinal axis, from a second shape of a second portion in the plurality of bobbin portions.

Statement 14: The system of any of Statements 11-13, wherein the detector solenoid comprises a helical coil, the helical coil having a plurality of helical coil portions, wherein a first portion in the plurality of helical coil portions has a first shape which is distinct, using a longitudinal perspective along the longitudinal axis, from a second shape of a second portion in the plurality of helical coil portions.

Statement 15: The system of any of Statements 11-14, wherein: the detector solenoid comprises a bobbin and a helical coil; the helical coil has a plurality of helical coil portions, wherein a first helical coil portion in the plurality of helical coil portions has a first solenoid shape which is distinct, using a longitudinal perspective along the longitudinal axis, from a second solenoid shape of a second solenoid portion in the plurality of helical coil portions; and the bobbin has a plurality of bobbin portions, wherein a first bobbin portion in the plurality of bobbin portions has a first bobbin shape which is distinct, using the longitudinal perspective along the longitudinal axis, from a second bobbin shape of a second bobbin portion in the plurality of bobbin portions.

Statement 16: The system of any of Statements 11-15, wherein the detector solenoid comprises a bobbin and a helical coil, wherein at least one of the bobbin and the helical coil has a shape from a list comprising: a cylinder shape, a hyperboloid shape, an inverse hyperboloid shape, a triangular shape, an inverse triangular shape, an increasing step shape, a decreasing step shape, a symmetrical step shape, an asymmetrical step shape, a trapezoidal shape, an inverse trapezoidal shape, a parabolic funnel shape, a double parabolic shape, and a step funnel shape.

Statement 17: The system of Statement 16, wherein the bobbin and the helical coil are not both the cylinder shape.

Statement 18: The system of any of Statements 11-17, wherein the non-uniform solenoid response is caused by varying, along the longitudinal axis, a gauge of solenoid wire.

Statement 19: The system of any of Statements 11-18, wherein the non-uniform solenoid response is caused by varying, along the longitudinal axis, a spacing between subsequent solenoid coils.

Statement 20: The method of any of Statements 11-19, wherein the structure is a pipe.

Statement 21: A computer-readable storage device having instructions stored which, when executed by a computing device, cause the computing device to perform operations comprising: while an remote field testing probe is moving, causing generation of a magnetic field such that a detector solenoid detects a measured magnetic field which is the magnetic field modified by a presence of nearby pipe, wherein the detector solenoid has a non-uniform solenoid response along a longitudinal axis extending from a one end of the detector solenoid to the opposite end of the detector solenoid; and determining pipe properties of interest from an analysis of the measured magnetic field.

Statement 22: The computer-readable storage device of Statement 21, wherein the non-uniform solenoid response comprises one of: (1) a first portion of the detector solenoid having a number of turns per longitudinal length different from a second portion of the detector solenoid and/or (2) the first portion of the detector solenoid having a cross sectional winding area which is distinct from that of the second portion of the detector solenoid.

Statement 23: The computer-readable storage device of Statement 21 or 22, wherein the detector solenoid comprises a bobbin, the bobbin having a plurality of bobbin portions, wherein a first portion in the plurality of bobbin portions has a first shape which is distinct, using a longitudinal perspective along the longitudinal axis, from a second shape of a second portion in the plurality of bobbin portions.

Statement 24: The computer-readable storage device of any of Statements 21-23, wherein the detector solenoid comprises a helical coil, the helical coil having a plurality of helical coil portions, wherein a first portion in the plurality of helical coil portions has a first shape which is distinct, using a longitudinal perspective along the longitudinal axis, from a second shape of a second portion in the plurality of helical coil portions.

Statement 25: The computer-readable storage device of any of Statements 21-24, wherein: the detector solenoid comprises a bobbin and a helical coil; the helical coil has a plurality of helical coil portions, wherein a first helical coil portion in the plurality of helical coil portions has a first solenoid shape which is distinct, using a longitudinal perspective along the longitudinal axis, from a second solenoid shape of a second solenoid portion in the plurality of helical coil portions; and the bobbin has a plurality of bobbin portions, wherein a first bobbin portion in the plurality of bobbin portions has a first bobbin shape which is distinct, using the longitudinal perspective along the longitudinal axis, from a second bobbin shape of a second bobbin portion in the plurality of bobbin portions.

Statement 26: The computer-readable storage device of any of Statements 21-25, wherein the detector solenoid comprises a bobbin and a helical coil, wherein at least one of the bobbin and the helical coil has a shape from a list comprising: a cylinder shape, a hyperboloid shape, an inverse hyperboloid shape, a triangular shape, an inverse triangular shape, an increasing step shape, a decreasing step shape, a symmetrical step shape, an asymmetrical step shape, a trapezoidal shape, an inverse trapezoidal shape, a parabolic funnel shape, a double parabolic shape, and a step funnel shape.

Statement 27: The computer-readable storage device of Statement 26, wherein the bobbin and the helical coil are not both the cylinder shape.

Statement 28: The computer-readable storage device of any of Statements 21-27, wherein the non-uniform solenoid response is caused by varying, along the longitudinal axis, a gauge of solenoid wire.

Statement 29: The computer-readable storage device of any of Statements 21-28, wherein the non-uniform solenoid response is caused by varying, along the longitudinal axis, a spacing between subsequent solenoid coils.

Statement 30: The computer-readable storage device of any of Statements 21-29, wherein the structure is a pipe.

I claim:

1. A method comprising: providing a remote field testing probe in a wellbore containing pipe; generating a magnetic field on the remote field testing probe while the remote field testing probe is moving;
detecting, at an array of detector solenoids on the remote field testing probe, a measured magnetic field which is the magnetic field modified by a presence of the pipe, wherein at least one detector solenoid of the array of detector solenoids comprises a non-uniform solenoid response increasing quadratically along a longitudinal axis extending from a first end of the at least one detector solenoid to a middle point where the non-uniform solenoid response peaks then decreasing quadratically to an opposite end of the at least one detector solenoid, the non-uniform solenoid response comprising a non-uniform turn density and a non-uniform winding area; and
determining properties and at least one defect of the pipe using the measured magnetic field via signal processing in conjunction with modeling; wherein,
at least one detector solenoid of the array of detector solenoids comprises a bobbin and a helical coil;
the helical coil has a plurality of helical coil portions, wherein a first helical coil portion in the plurality of helical coil portions has a first solenoid shape which is distinct, using a longitudinal perspective along the longitudinal axis, from a second solenoid shape of a second solenoid portion in the plurality of helical coil portions; and
the bobbin has a plurality of bobbin portions, wherein a first bobbin portion in the plurality of bobbin portions has a first bobbin shape which is distinct, using the longitudinal perspective along the longitudinal axis, from a second bobbin shape of a second bobbin portion in the plurality of bobbin portions;
wherein the non-uniform solenoid response is caused by varying, along the longitudinal axis, a spacing between subsequent solenoid coils.

2. The method of claim 1, wherein the non-uniform solenoid response is due to one of: (1) a first portion of at least one detector solenoid of the array of detector solenoids having a distinct number of turns per longitudinal length different from a second portion of the detector solenoid or (2) the first portion of the detector solenoid having a cross sectional winding area which is distinct from that of the second portion of the detector solenoid.

3. The method of claim 1, wherein at least one detector solenoid of the array of detector solenoids comprises a bobbin and a helical coil, wherein at least one of the bobbin and the helical coil has a shape from a list comprising: a cylinder shape, a hyperboloid shape, an inverse hyperboloid shape, a triangular shape, an inverse triangular shape, an increasing step shape, a decreasing step shape, a symmetrical step shape, an asymmetrical step shape, a trapezoidal shape, an inverse trapezoidal shape, a parabolic funnel shape, a double parabolic shape, and a step funnel shape.

4. The method of claim 3, wherein the bobbin and the helical coil are not both the cylinder shape.

5. The method of claim 1, wherein the non-uniform solenoid response is caused by varying, along the longitudinal axis, a gauge of solenoid wire.

6. A system comprising:
a remote field testing probe comprising an array of detector solenoids, wherein at least one detector solenoid of the array of detector solenoids comprises a non-uniform solenoid response increasing quadratically along a longitudinal axis extending from a first end of the at least one detector solenoid to a middle point where the non-uniform solenoid response peaks then decreasing quadratically to an opposite end of the at least one detector solenoid, the non-uniform solenoid response comprising a non-uniform turn density and a non-uniform winding area; a processor; and
a non-transitory computer-readable storage medium having instructions stored which, when executed by the processor, cause the processor to perform operations comprising:
causing the remote field testing probe to generate a magnetic field as the remote field testing probe moves;

receiving a measured magnetic field from the remote field testing probe, wherein the measured magnetic field is the magnetic field modified by a presence of nearby pipe; and determining pipe properties and at least one defect of the pipe from the measured magnetic field; wherein, at least one detector solenoid of the array of detector solenoids comprises a bobbin and a helical coil;

the helical coil has a plurality of helical coil portions, wherein a first helical coil portion in the plurality of helical coil portions has a first solenoid shape which is distinct, using a longitudinal perspective along the longitudinal axis, from a second solenoid shape of a second solenoid portion in the plurality of helical coil portions; and the bobbin has a plurality of bobbin portions, wherein a first bobbin portion in the plurality of bobbin portions has a first bobbin shape which is distinct, using the longitudinal perspective along the longitudinal axis, from a second bobbin shape of a second bobbin portion in the plurality of bobbin portions;

wherein the non-uniform solenoid response is caused by varying, along the longitudinal axis, a spacing between subsequent solenoid coils.

7. The system of claim 6, wherein at least one detector solenoid of the array of detector solenoids comprises a bobbin and a helical coil, wherein at least one of the bobbin and the helical coil has a shape from a list comprising: a cylinder shape, a hyperboloid shape, an inverse hyperboloid shape, a triangular shape, an inverse triangular shape, an increasing step shape, a decreasing step shape, a symmetrical step shape, an asymmetrical step shape, a trapezoidal shape, an inverse trapezoidal shape, a parabolic funnel shape, a double parabolic shape, and a step funnel shape.

8. The system of claim 7, wherein the bobbin and the helical coil are not both the cylinder shape.

9. The system of claim 6, wherein the non-uniform solenoid response is caused by varying, along the longitudinal axis, a gauge of solenoid wire.

10. A non-transitory computer-readable storage device having instructions stored which, when executed by a computing device, cause the computing device to perform operations comprising:

while a remote field testing probe is moving within a wellbore containing pipe, causing generation of a magnetic field such that an array of detector solenoids detects a measured magnetic field which is the magnetic field modified by a presence of nearby pipe, wherein at least one detector solenoid of the array of detector solenoids comprises a non-uniform solenoid response increasing quadratically along a longitudinal axis extending from a first end of the at least one detector solenoid to a middle point where the non-uniform solenoid response peaks then decreasing quadratically to an opposite end of the at least one detector solenoid, the non-uniform solenoid response comprising a non-uniform turn density and a non-uniform winding area; and determining pipe properties and at least one defect of the pipe from the measured magnetic field; wherein, at least one detector solenoid of the array of detector solenoids comprises a bobbin and a helical coil;

the helical coil has a plurality of helical coil portions, wherein a first helical coil portion in the plurality of helical coil portions has a first solenoid shape which is distinct, using a longitudinal perspective along the longitudinal axis, from a second solenoid shape of a second solenoid portion in the plurality of helical coil portions; and the bobbin has a plurality of bobbin portions, wherein a first bobbin portion in the plurality of bobbin portions has a first bobbin shape which is distinct, using the longitudinal perspective along the longitudinal axis, from a second bobbin shape of a second bobbin portion in the plurality of bobbin portions;

wherein the non-uniform solenoid response is caused by varying, along the longitudinal axis, a spacing between subsequent solenoid coils.

\* \* \* \* \*